United States Patent [19]

Hutchinson

[11] Patent Number: 4,715,764
[45] Date of Patent: Dec. 29, 1987

[54] GATE VALVE FOR WAFER PROCESSING SYSTEM

[75] Inventor: Martin A. Hutchinson, Santa Clara, Calif.

[73] Assignee: Varian Associates, Inc., Palo Alto, Calif.

[21] Appl. No.: 856,876

[22] Filed: Apr. 28, 1986

[51] Int. Cl.⁴ .............................................. B65G 51/02
[52] U.S. Cl. ...................................... 414/217; 414/225
[58] Field of Search ............... 419/222, 217, 225, 417; 251/327, 328

[56] References Cited

U.S. PATENT DOCUMENTS

| | | | |
|---|---|---|---|
| 266,664 | 10/1882 | Viney | 251/328 X |
| 631,699 | 8/1899 | Darragh et al. | 251/327 X |
| 925,880 | 6/1909 | Doolittle | 251/327 |
| 964,838 | 7/1910 | Badger | 251/328 X |
| 3,656,454 | 4/1972 | Schrader | 414/217 X |
| 3,921,788 | 11/1975 | Roberson, Jr. et al. | 414/417 X |
| 4,318,767 | 3/1982 | Hijikata et al. | 414/225 X |
| 4,412,771 | 11/1983 | Gerlach et al. | 414/217 |
| 4,433,951 | 2/1984 | Koch et al. | 414/222 X |
| 4,584,045 | 4/1986 | Richards | 414/222 X |

*Primary Examiner*—Peter A. Aschenbrenner
*Attorney, Agent, or Firm*—Stanley Z. Cole; Gerald M. Fisher; Terrence E. Dooher

[57] ABSTRACT

A modular wafer processing system requires a gate valve of minimum thickness. A gate valve is provided in which the gate is an assymetric wedge on an assymetrically mounted drive shaft.

11 Claims, 8 Drawing Figures

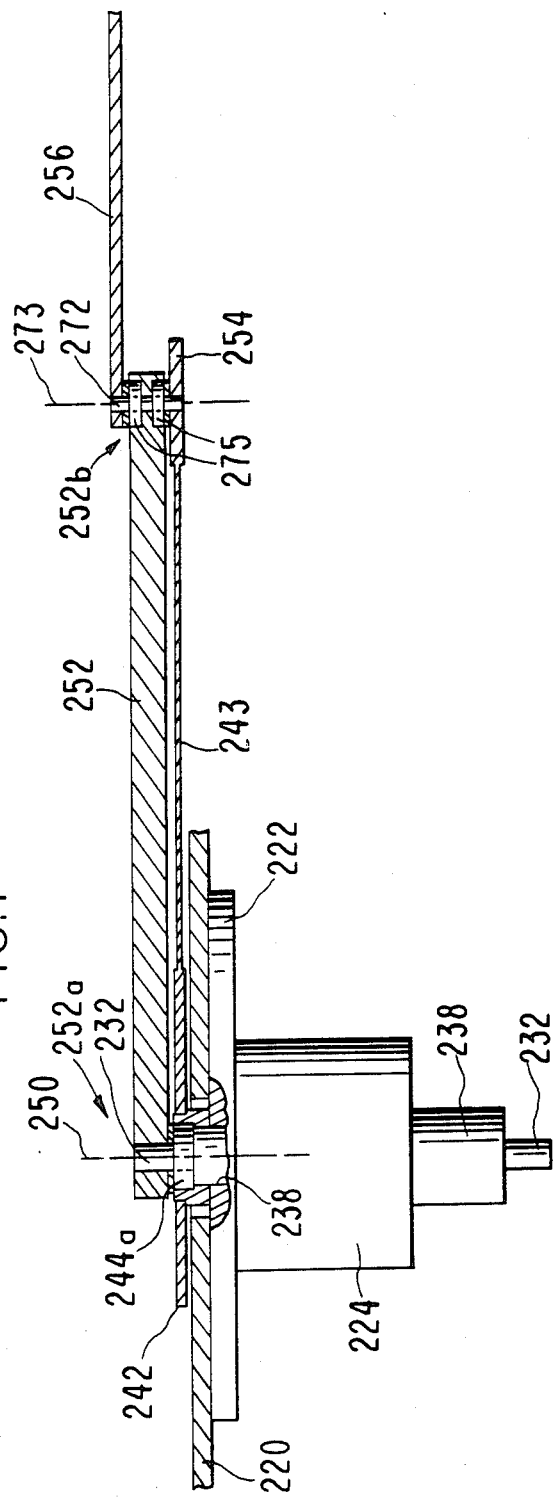

4,715,764

GATE VALVE FOR WAFER PROCESSING SYSTEM

FIELD OF THE INVENTION

This invention pertains to a gate valve particularly suitable for use in a wafer processing machine.

BACKGROUND OF THE INVENTION

Various gate valves are used in wafer processing machine to isolate chambers of the machine. In machines where wafer handling arms are used to move the wafers through the valves it is desirable to make the valves as thin as possible to reduce the extension of the robot arm to a manageable extent.

OBJECT OF THE INVENTION

It is an object of the invention to describe a thin gate valve compatible with a semiconductor processing environment.

BRIEF SUMMARY OF THE INVENTION

Wedge valves have the advantage of providing a positive seal. Symmetric wedge valves in general are thick. According to the invention, the wedge is made asymmetric and the drive shaft is displaced to balance the asymmetric wedge. The wedge valve can thereby be made much thinner.

These and further constructional and operational characteristics of the invention will be more evident from the detailed description given hereinafter with reference to the figures of the accompanying drawings which illustrate one preferred embodiment and alternatives by way of non-limiting examples.

BRIEF DESCRIPTION OF THE DRAWINGS

FIG. 7 shows a partial sectional view of the arm of FIG. 6.

DETAILED DESCRIPTION OF THE PREFERRED EMBODIMENTS

Figure 1:
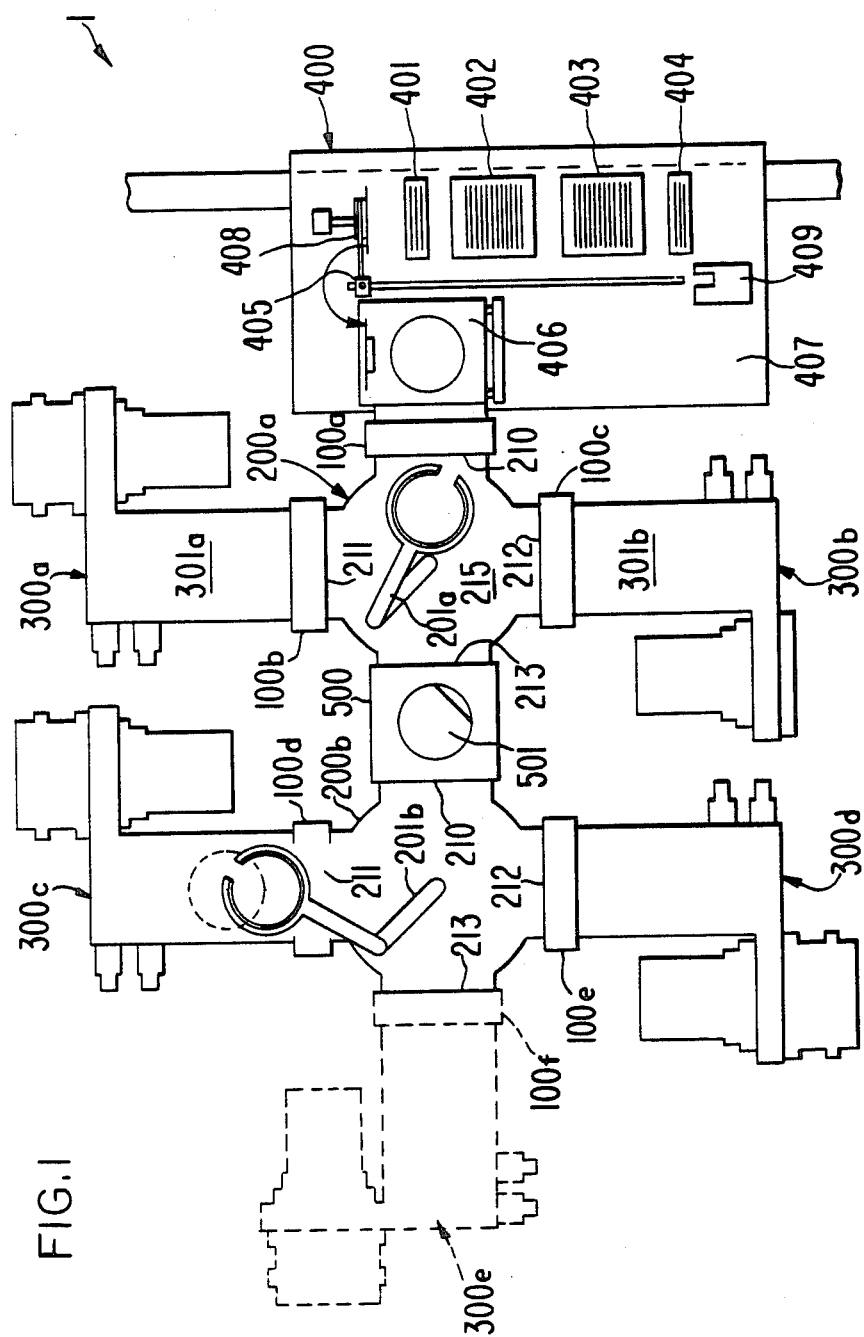
FIG. 1 is a partially schematic plan view of one embodiment of the system according to the invention.

Referring now to the drawings wherein reference numerals are used to designate parts throughout the various figures thereof, there is shown in FIG. 1 a partially schematic plan view of one embodiment of modular semiconductor wafer transport and processing system 1 of the present invention. Modular wafer processing system 1 includes wafer handler and loadlock module 400, gate valve modules 100a–100f, transfer modules 200a and 200b, process modules 300a–300d, and passthrough module 500 connected between transfer modules 200a and 200b.

Wafer handler and loadlock module 400 is generally rectangular in plan view and region 407 exterior to loadlock chamber 406 and within the confines of module 400 is at atmospheric pressure. A controlled, low particulate atmosphere environment is provided in this portion of the system. In operation, a selected wafer to be processed is loaded from a selected one of semi-standard or equivalent wafer cassettes 402–403 in wafer handler and loadlock module 400 by means of wafer handler 405 which transports the selected wafer from its cassette to wafer aligner and flat finder 408 and from wafer aligner 408 to loadlock chamber 406. Wafers may also be loaded from cassette 404 which is reserved for process qualification wafers. Cassette 401 is a storage cassette allowing wafers to cool after processing before being placed in one of the other cassettes or thin film monitor 409. Wafer cassettes 401–404 are tilted at a small angle relative to the horizontal, for example, 7 degrees, so that the planar surfaces of the wafers in cassettes 401–404 are offset from the vertical by this same small angle so that the wafers are tilted to be in a known direction relative to the wafer retaining slots in the cassette when resting in their cassettes. During the transfer of a selected wafer from its cassette into loadlock chamber 406, the wafer is first moved by wafer handler 405, while maintaining the surface of the wafer in a vertical orientation, to wafer aligner 408. The selected wafer is then rotated so that the planar surfaces of the wafer are horizontal and placed in load lock 406, which is then open to the atmosphere. The planar surfaces of the wafer then remain horizontal during the transport of the wafer through gate valve module 100a into transfer module 200a by transfer arm 201a which extends through entry/exit port 210 of transfer module 200a and gate valve module 100a to withdraw the wafer in loadlock chamber 406.

Transfer module 200a has four ports, 210, 211, 212 and 213. Ports 210, 211 and 212 are controlled by gate valve modules 100a, 100b and 100c, respectively. Port 211 and its corresponding gate valve module 100b connects chamber 215 of transfer module 200a with chamber 301a of process module 300a. Similarly, port 212 and corresponding gate valve module 100c connects chamber 215 of transfer module 200a with chamber 301b of processing module 300b. Interior chamber 215 of transfer module 200a is maintained at a selected pressure less than atmospheric pressure by a conventional pumping mechanism (not shown in FIG. 1). In order to increase the rate at which chamber 215 may be evacuated, chamber 215 is dimensioned relative to arm 201a to minimize the volume of chamber 215.

After unloading the wafer from loadlock chamber 406, transfer arm 201a retracts into transfer chamber 215 and gate valve 100a is closed. Transfer arm 201a then rotates through a selected angle in order to present the wafer to a selected process port 211 or 212, or to transfer port 213. When a selected wafer is presented to a process port, e.g., port 211, the corresponding gate valve module, e.g., module 100b, which is closed during the transfer of the selected wafer from loadlock 406 into chamber 215 of transfer module 200a, is opened by means of a control system (not shown). Arm 201a is then extended through the process port, e.g., port 211, and the corresponding gate valve module, e.g., module 100b, into the corresponding process chamber, e.g., chamber 301a of the corresponding process module, e.g., 300a. The wafer is then off-loaded by means not shown in FIG. 1.

The process modules 301a and 301b may be the same, so that the same operation is performed therein, or these modules may be different with different operations being performed therein. In either case, the provision of two process modules 300a and 300b connected to transfer module 200a via ports 211 and 212 and gate valve modules 100b and 100c, respectively, together with entry/exit port 210 and valve 100a connecting transfer module 200a to wafer handler and loadlock 400 permits non-serial processing of wafers and increased throughputs compared to sequential processing systems. The time required to transfer a wafer from a wafer cassette and off-load the wafer in a selected process module is typically much less than the time required for the processing of the wafer within the process module. Thus, when a first wafer has been transferred from an input cassette into a selected one of process modules 300a and 300b, during the initial period of processing in process chamber 300a, a second wafer may be transported from loadlock chamber 406 to process module 300b. Transfer arm 201a may then rotate back to port 211 to await the completion of processing of the wafer in process module 300a. Thus, during a substantial portion of the time processing is occurring simulataneously in process modules 300a and 300b. If desired, process module 300b may be a pre-process module for sputter etch cleaning, or for deposition of a metal film by a process other than sputtering, for example chemical vapor deposition, when the main process stations are employed for sputter deposition. The wafers may then be processed in the remaining process chambers in system 1.

The provision of the second entry/exit port 213 in transfer module 200a permits connection to additional process modules 300c and 300d. Transfer module 200a is connected to an identical transfer module 200b (corresponding parts bear the same numerals) via pass-through module 500. Pass-through module 500 connects entry/exit port 213 of transfer module 200a with entry/exit port 210 of transfer module 200b, thus forming a single vacuum chamber. When it is desired to transfer a wafer carried by arm 201a to one of process chambers 300c and 300d, the wafer is offloaded to a flat aligner 501 in pass-through module 500. The wafer is then on-loaded to arm 201b of transfer module 200b and transferred into the selected one of process modules 300c through 300e by arm 201b via corresponding gate valve modules 100d through 100f. When a wafer has been completely processed, it is returned from the processing module in which it resides to loadlock chamber 406 and thence to a selected cassette (401–404) via transfer arm 201a or via transfer arm 201b, pass-through chamber 501 and transfer arm 201a. Process module 300e is drawn with dashed lines to indicate that it is optional and to illustrate the capability of adding modules at will.

The system shown in FIG. 1 may be expanded linearly by replacing gate valve 100f and process module 300e by a pass-through module, identical to pass-through module 500, connecting transfer module 200b with a transfer module (not shown) identical to transfer module 200b, which is in turn connected to a corresponding plurality of process modules. The system shown in FIG. 1 may also be expanded in a non-linear fashion by replacing process module 300d by a pass-through module, identical to pass-through module 501, connecting transfer module 200b with a transfer module (not shown) identical to transfer module 200b which is connected to a corresponding plurality of process chambers. If desired, optional process module 300e may also be replaced by a second wafer handler and loadlock module identical to wafer handler and loadlock module 400.

The configuration of the processing system shown in FIG. 1 permits non-serial processing, i.e., any wafer entering loadlock 406 may be transferred to a selected process chamber without passing through any other process chamber and any wafer may be transferred from a selected process chamber to any other selected process chamber or to loadlock chamber 406 without passing through any intermediate process chamber. The operation of the transfer arms, gate valves, flat aligners and loadlock chamber in system 1 are controlled by a master controller circuit (not shown). The master controller circuit is typically operated so that the gate valves are sequenced so that no given process chamber is in direct communication with another process chamber. Thus the system provides complete dynamic isolation.

The non-serial processing afforded by system 1 permits continued operation of the remaining process modules when a particular process module is inoperative. The non-serial processing also permits the performance of a replacement process module or of any designated process module to be checked while the remainder of the system continues to operate. For example, if it is desired to check the performance of module 300c, a monitor wafer stored in cassette 404 may be transferred into process chamber 300c, processed and returned to cassette 404. During the processing in chamber 300c, the remainder of system 1 continues to process production wafers.

Figure 2:
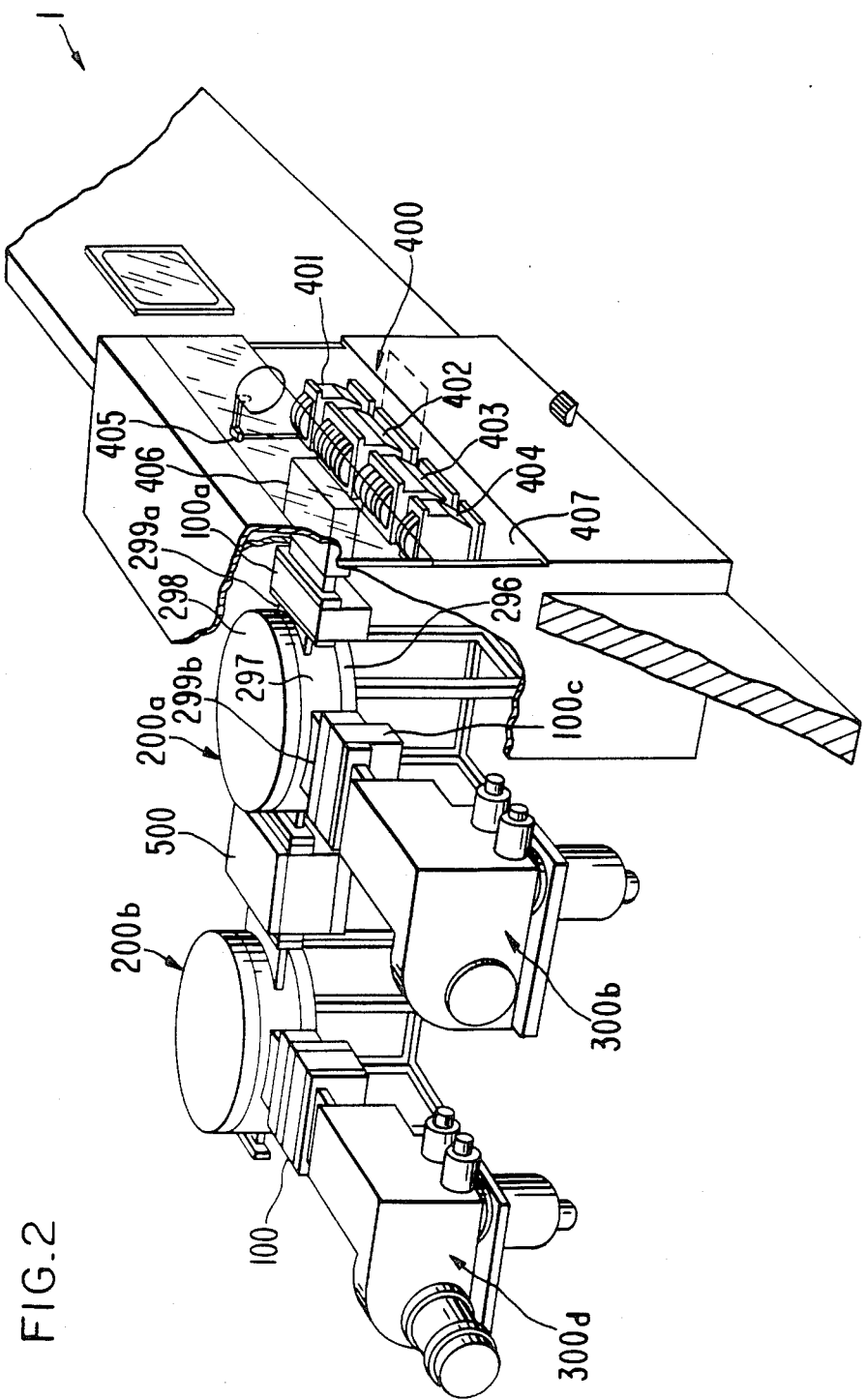
FIG. 2 shows a partial perspective view of the system shown in FIG. 1.

FIG. 2 shows a partial perspective view of the semiconductor wafer transport and processing system shown in FIG. 1. In particular the housing of transfer module 200a is generally cylindrical in shape, and includes circular top 298, circular bottom 296 and cylindrical wall 297, joining top 298 and bottom 296. The housing may be made of any suitable vacuum compatible material, for example, stainless steel.

The ports of each transfer chamber are defined by extensions of the housing which form horizontal slots extending from interior chamber 215 to the exterior of the housing. For example, port 210 (FIG. 1) is defined by housing extension 299a, shown in FIG. 2.

Figure 3:
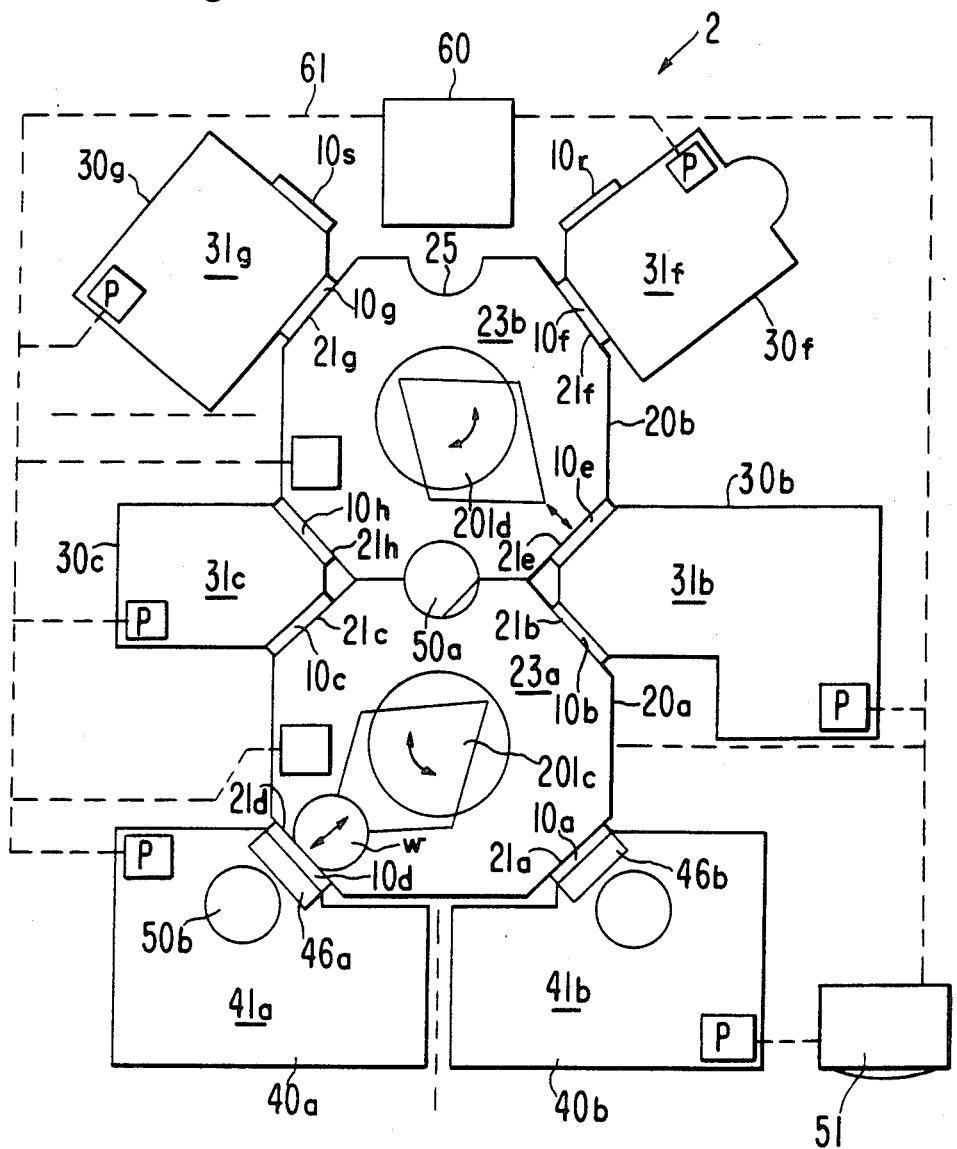
FIG. 3 shows a partially schematic plan view of a second embodiment of the system according to the invention.

FIG. 3 shows a partially schematic plan view of a second embodiment of the wafer transport and processing system of the present invention. Wafer transport and processing system 2 includes entry wafer handler and loadlock module 40a, exit wafer handler and loadlock module 40b transfer modules 20a and 20b, gate valve modules 10a–10h, and process chambers 30b, 30c, 30f and 30g. Wafer handler and loadlock module 40a is the same as wafer handler and loadlock module 400 shown in FIG. 1. Transfer module 20a includes a vacuum chamber having ports 21a–21d for communicating the interior 23a of transfer module 20a with the exterior of module 20a. Ports 21a–21d are opened and closed by gate valve modules 10a–10d. Transfer module 20a is connected to an identical transfer module 20b via flat aligner 50a, thus forming a single vacuum chamber which is evacuated by conventional pumping means not shown in FIG. 3. Flat aligner 50a may be replaced by any suitable means for positioning a wafer in a desired rotational orientation. Transfer module 23b has four ports, 21e–21h, which are opened and closed by gate valve modules 10e–10h, respectively. The interior 31c of reactive ion etch module 30c is connected to interior chamber 23a of transfer module 20a and to interior chamber 23b of transfer module 20b via ports 21c and 21h, respectively, which are controlled by gate valve modules 10c and 10h, respectively. Similarly, the interior chamber 31b of sputter module 30b communicates with interior chambers 23a and 23b of transfer modules 20a and 20b via ports 21b and 21e, respectively, which are controlled by gate valve modules 10b and 10e, respectively. Port 21g, controlled by gate valve module 10g, connects interior chamber 23b of transfer module 20b with interior chamber 31g of chemical vapor deposition module 30g. Port 21f, controlled by gate valve module 10f, communicates interior chamber 23b of transfer module 20b with interior chamber 31f of rapid anneal module 30f.

Master controller 60 communicates with each process chamber controller P and with entry module 40a and exit module 40b and operator control panel via standard communication bus 61.

In operation, a selected wafer is transported by a wafer handler (not shown in FIG. 3.) from a selected wafer cassette (not shown in FIG. 3) in entry module 40a to flat finder 50b and thence to loadlock chamber 46a, which is the same as loadlock chamber 406 shown in FIG. 1. Transfer arm 201c of transfer module 20a extends into loadlock chamber 46a via port 21d which is opened and closed by gate valve module 10d. The selected wafer is then on-loaded to transport arm 201c which then retracts into interior chamber 23a of transfer module 20a. Arm 201c then rotates through a selected angle to present the selected wafer to port 21c or 21b or to flat finder 50a. A wafer transferred to flat finder 50a may be on-loaded onto either transport arm 201d or onto transport arm 201c. Wafers on-loaded from flat finder 50a to transport arm 201d are then retracted by transport arm 201d into chamber 23b rotated through a suitable angle and presented to a selected port 21g or 21f. The gate valve module controlling the selected port then opens the port and transport arm 201d extends into the interior chamber of the selected process module where it is off-loaded by means not shown in FIG. 3. When flat orientation is not required for a wafer or circularly symmetric substrate, the wafer or substrate can be transferred from transport arm 201c into process chamber 31c or process chamber 31b via gate valves 10c and 10b, respectively, and from there, via gate valves 10h and 10e, repectively, directly to transport arm 201d bypassing flat finder 50a. When a wafer has been completely processed, the wafer is on-loaded to the transport arm servicing the process module in which the wafer is located, and transferred back to exit port 21a. For a wafer in process module 30b or 30c, this is accomplished through the retraction of transport arm 201c from the process chamber, followed by a suitable rotation of transport arm 201c, which is then extended through port 21a, which is controlled by gate valve module 10a, into loadlock chamber 46b. For a wafer in process module 30g or 30f, the wafer is first transferred to transport arm 201d and from arm 201d to arm 201c via flat finder 50a.

Semicircular arc 25 denotes that the system shown in FIG. 3 may be expanded by adjoining a third transfer module similar to transfer module 20b to a flat finder located at semicircular arc 25.

The modules shown in the embodiment of FIG. 3 are interchangeable, allowing the system to be configured with any combination of modules that may be desired.

The system shown in FIG. 3 has the same advantage of non-serial processing as the system shown in FIG. 1. The system shown in FIG. 3 is somewhat more flexible in that transport arm 201d services four processing ports and transfer arm 201c services two processing ports and both an entry and exit module. If desired, entry module 41a may serve as both an entry and exit module and exit module 41b may be replaced by a process module. Similarly, if desired, any process module may be replaced by an exit module or by an entry module.

Figure 4:
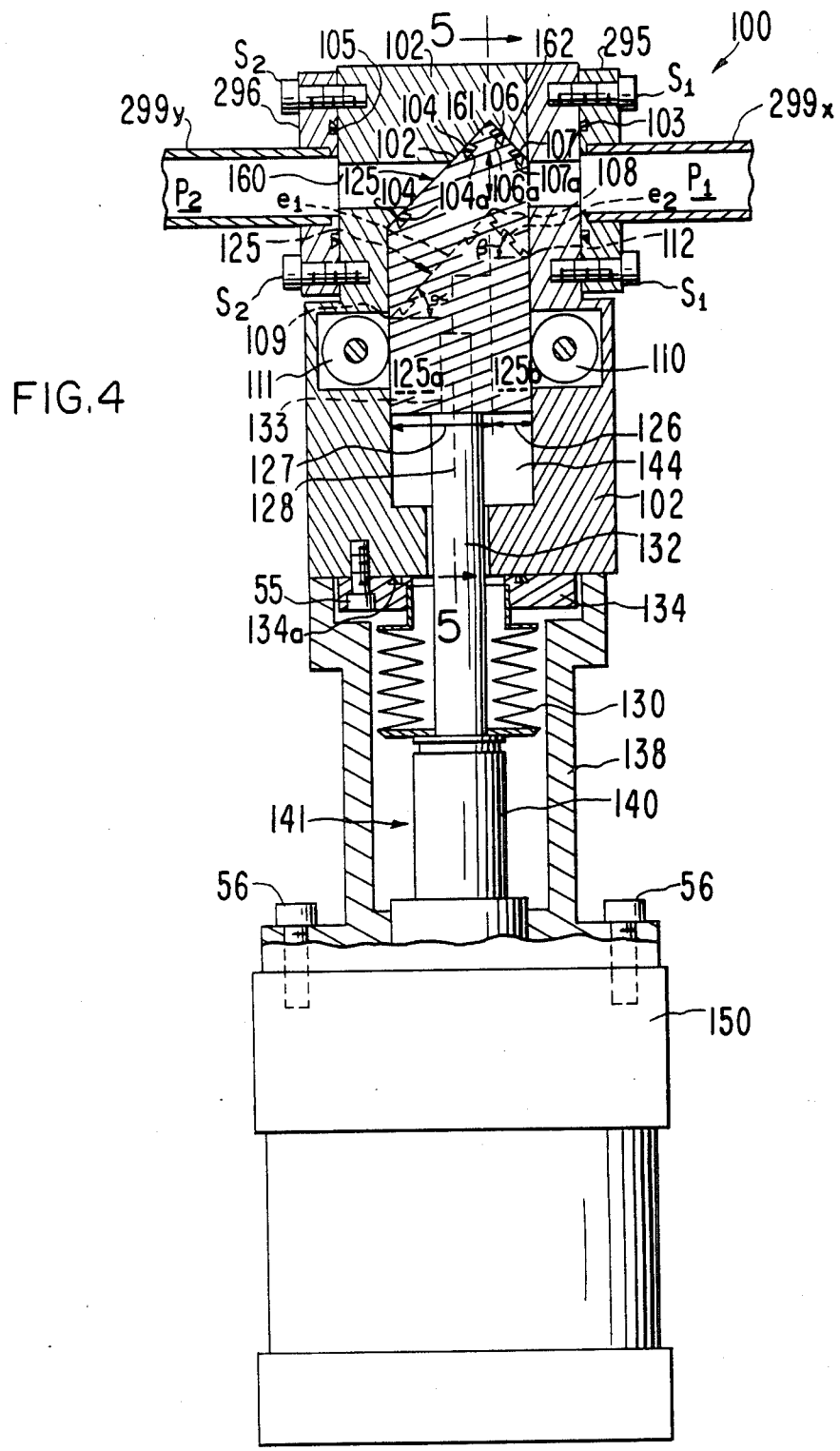
FIG. 4 shows a partially cutaway side view of the gate valve module according to the invention.
Figure 5:
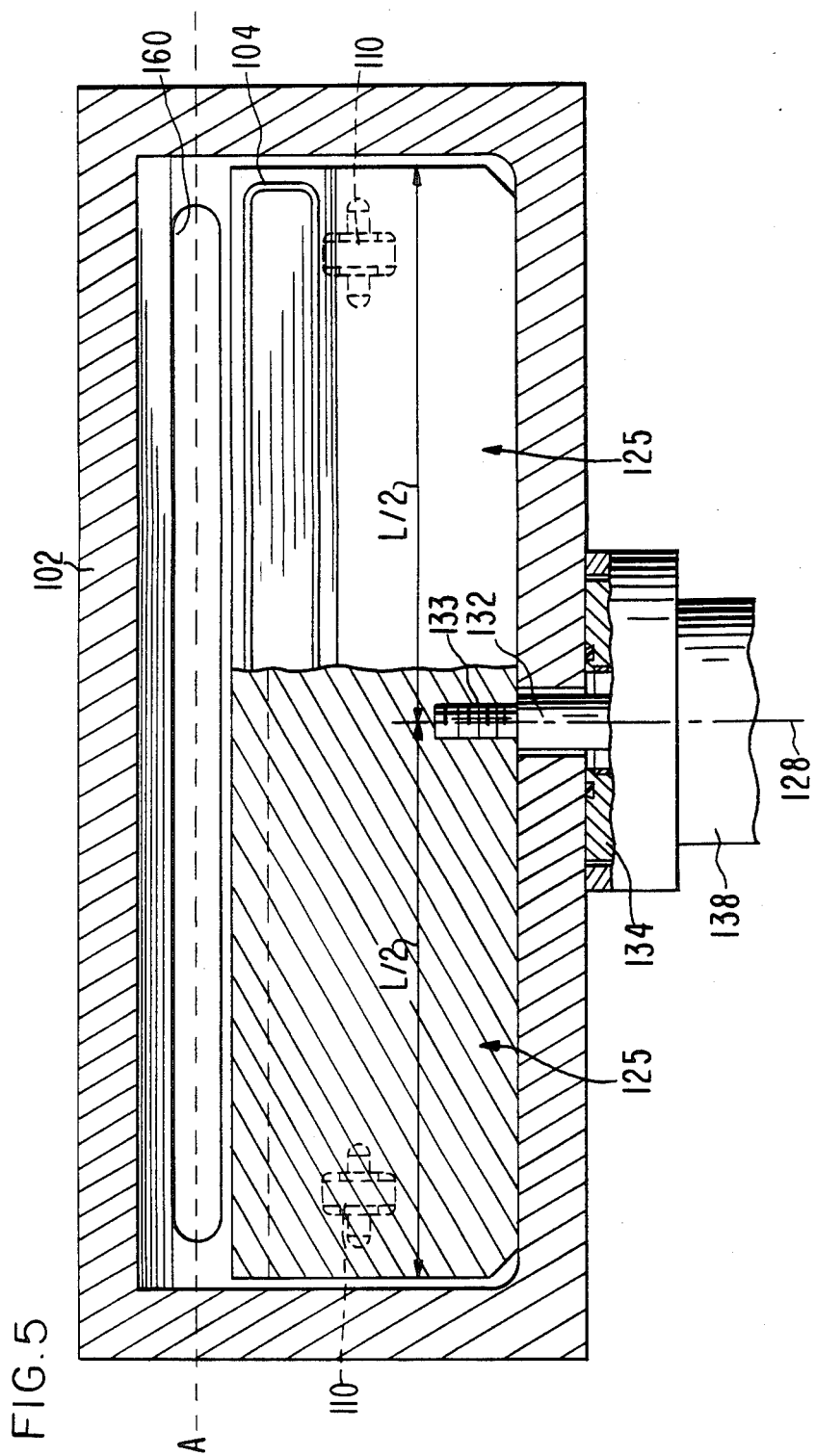
FIG. 5 shows a partially cutaway top view of the gate valve module of FIG. 4.

FIGS. 4 and 5 show a partially schematic cross section and a partial cutaway cross section, respectively, of one embodiment of gate valve module 100. Gate valve module 100 controls the passage between port $P_1$ and port $P_2$. Port $P_1$ is defined by extension 299x of the housing of a first chamber which is either a process chamber, a transfer chamber or a loadlock chamber, which extension forms a generally rectangular slot dimensioned to accommodate the extension therethrough of wafer transport arm 201 shown in FIG. 6. Such an extension (299a) of the housing of transfer module 200a is shown in perspective view in FIG. 2. Port $P_2$ is similarly defined by extension 299y of the housing of a second chamber (not shown in FIG. 4).

Housing extensions 299x and 299y defining ports $P_1$ and $P_2$ are attached to valve body 102 by means of a first plurality of screws $S_1$ and a second plurality of screws $S_2$ driven through flanges 295 and 296 respectively. Valve body 102 may be made of stainless steel or other suitable material. Elastomeric O-rings 103 and 105 between flanges 295 and 296 respectively and body 102 provide a vacuum seal. Valve body 102 has a horizontal slot 160 which extends from port $P_1$ to port $P_2$ when valve gate 125 is lowered to the phantom position shown by the dashed lines in FIG. 4. Slot 160 is shown in side view in FIG. 5 and is dimensioned to accommodate the extension of wafer transport arm 201 shown in FIG. 6 from port $P_1$ to port $P_2$. The dashed line A in FIG. 5 denotes the central plane of slot 160. When valve gate 125 is in its fully retracted position it does not extend into slot 160. This position is denoted by the dashed line in FIG. 4. When gate 125 is in its fully extended position, elastomeric O-ring 104, which is seated in notch 104a, forms a vacuum seal between port $P_1$ and port $P_2$. Elastomeric strips 106 and 107 seated in notches 106a and 107a, respectively, do not perform a vacuum sealing function. Rather, when valve gate 125 is in its fully extended position, strips 106 and 107 provide contact between body 102 and gate 125 so that a rotational moment is produced on gate 125 which opposes the rotational moment on gate 125 produced by the contact between elastomeric O-ring 104, body 102 and valve gate 125. In cross-section, valve gate 125 is a union of two trapezoids 125a and 125b. Edge $E_1$ of trapezoid 125a extends from point 109 to point 108 forming an acute angle alpha of approximately 45° with the horizontal. A substantially larger angle is not desirable since it would then be difficult for elastomeric O-ring 104 to sealingly engage body 102 when valve gate 125 is fully extended. Edge $E_2$ of trapezoid 125b forms an angle beta with the horizontal. In the embodiment shown in FIG. 4 the angle alpha equals the angle beta but this is not critical.

A novel feature of gate valve module 100 is the asymmetry of the cross section of valve gate 125. Since only O-ring 104 provides a vacuum sealing function, trapezoid 125b is made substantially narrower than trapezoid 125a; i.e., the length of line segment 126 is less than the length of line segment 127. In one embodiment, the difference in length between line segment 126 and line segment 127 is approximately one inch. Thus the distance between port P₁ and port P₂ is substantially reduced compared to prior art valve modules which employ two O-rings and wherein trapezoid 125b is congruent to trapezoid 125a.

Bearings 110 and 111 serve to guide valve gate 125 as it translates vertically in slot 144 of body 102. Valve gate 125 is mounted on shaft 132 which is screwed into valve gate 125 by threaded extension 133 of shaft 132. Valve body 102 is mounted to housing 138 by screws 15 (not shown). Metal bellows 130 is mounted by flange 134 to body 102 by screws 55. Stainless steel shaft 140 has a greater diameter than stainless steel shaft 132. Elastomeric O-ring 134a between flange 134 and valve gate body 102 provides a vacuum seal between the chambers (not shown) connected to ports P₁ and P₂ and the atmosphere exterior to valve module 100. Shaft 132 is coaxial with and rigidly mounted on shaft 140. Shaft 140 translates vertically in cylindrical cavity 141 formed by housing 138 thus causing valve gate 125 to translate vertically in slot 144. As shown in FIG. 5, shaft 132 is positioned so that longitudinal axis 128 of shaft 132 is located at the lengthwise midpoint of valve gate 125 having length L. Shaft 132 is also positioned so that the sum of the moments about the axis perpendicular to the plane of the cross-section shown in FIG. 4 and passing through axis 128 and the lower surface of valve body 125 is zero. These moments are caused by the forces acting upon O-ring 104 and elastomeric strips 106 and 107 when valve body 102 is fully extended. Housing 138 is mounted on air cylinder 150 by means of screws 56. Shaft 140 is translated vertically by a conventional air-driven piston mechanism 150.

Figure 6:
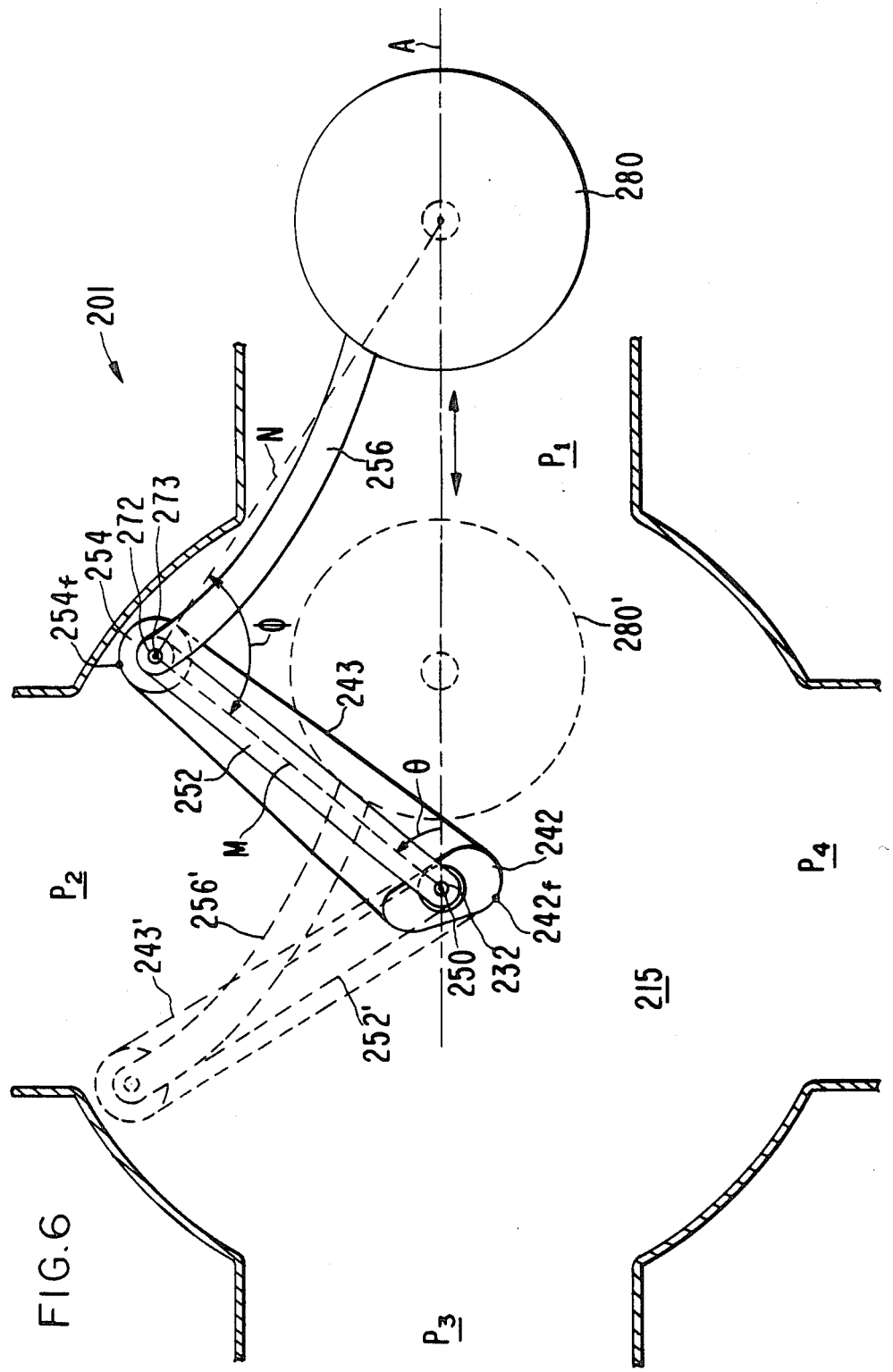
FIG. 6 shows a schematic top view of the wafer transport arm according to the invention with the arm shown also in phantom in a second position.
Figure 7A:
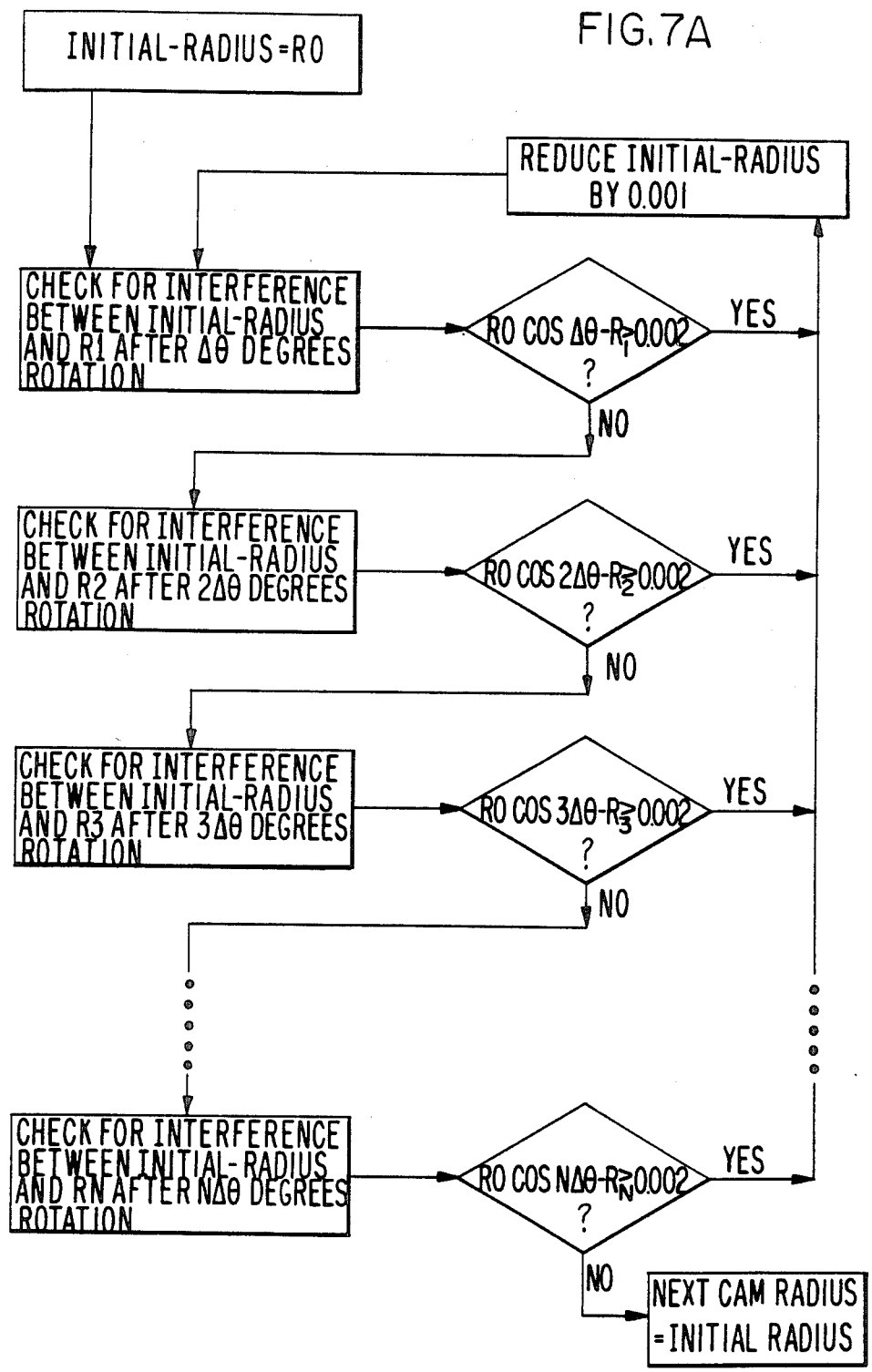
FIG. 7A shows a flow chart for deriving an actual cam profile from a theoretical cam profile.

FIG. 6 shows a plan view and FIG. 7 shows a partially cut-away side view of wafer transport arm mechanism 201. Arm mechanism 201 is one embodiment of transfer arm 201a employed in transfer module 200a of FIG. 1 or of arm 201 in module 20 in FIG. 3. Arm mechanism 201 includes cam 242, a first rigid arm 252, pulley 254, second rigid arm 256 and wafer holder 280.

Wafer holder 280, shown schematically in FIG. 6, is fixedly mounted on one end of arm 256. The other end of arm 256 is rotatably mounted to one end of arm 252 by means of shaft 272. Shaft 272, which passes through one end (252b) of arm 252, has one end fixedly attached to arm 256 and the other end fixedly attached to the center of pulley 254. Shaft 272 rotates about axis 273 against bearings 275, as shown in FIG. 7. Thus, arm 256 rotates with pulley 254. The other end (252a) of arm 252 is fixedly mounted on shaft 232 which is the inner shaft of dual shaft coaxial feedthrough 224 (FIG. 7). Vacuum feedthrough 224, for example a ferrofluidic feedthrough, provides a vacuum seal between the interior of housing 220 of wafer arm mechanism 201 and the exterior of housing 220. Vacuum feedthrough 224 is attached to housing 220 by means of flange 222. Such a ferrofluidic feedthrough is well known in the art; for example, a ferrofluidic feedthrough made by Ferrofluidic, Inc., may be used to implement the drive mechanism described herein. Outer shaft 238 of ferrofluidic feedthrough 224 is fixedly attached to cam 242. Both inner shaft 232 and outer shaft 238 are independently rotatable about the longitudinal axis 250 of shaft 232 and shaft 238 by means of a pair of motors 230 and 231 (not shown). Axis 250 is perpendicular to the floor of and passes through the center of vacuum chamber 215 containing arm 201.

Belt 243 is in contact with a portion of the perimeter of cam 242 and a portion of the perimeter of pulley 254. Belt 243 is fixed to cam 242 at point 242f on the perimeter of cam 242 and to pulley 254 at point 254f on the perimeter of the pulley. Belt 243 can be, for example, a stainless steel non-toothed belt or a metal cable.

FIG. 6 shows transport arm mechanism 201 fully extended through port P₁. In this embodiment, when arm 201 is fully extended through port P₁, the angle θ between axis M, the midline of arm 252 passing through axis 250 and axis 273, and the midline A of port P₁ which passes through axis 250, is approximately 30°. In other embodiments, other angles may be selected in place of 30°. In operation, arm 201 is retracted through port P₁ by a counterclockwise rotation of arm 252 about axis 250 while holding cam 242 fixed. This is accomplished by rotating inner shaft 232 of ferrofluidic feedthrough 224 while outer shaft 238 remains fixed. Cam 242 is shaped so that as arm 252 rotates in a counterclockwise direction, stainless steel cable 243 wraps and unwraps around cam 242 thereby rotating pulley 254 so that wafer holder 280 moves in a generally linear path along midline A from its fully extended position to a retracted position inside vacuum chamber 215 as shown by phantom position 280'.

Once wafer transfer arm 201 has been retracted inside chamber 215, both arm 252 and cam 242 are rotated through a selected angle by rotating both inner shaft 232 and outer shaft 238, respectively, through the same selected angles so that arm mechanism 201 is properly positioned to be extended through a second selected port. The ports P₁ through P₄ shown in FIG. 6 are 90° apart, so that for this embodiment shafts 232 and 238 are rotated through a multiple of 90° to position wafer transport arm 201 for an extension through another port. The extension is accomplished by rotating arm 252 about the axis of shaft 232 in a clockwise direction with respect to cam 242.

Of importance, as stainless steel cable 243 wraps and unwraps from cam 242 as wafer transport arm 201 is extended or retracted through a selected port, there is no sliding or rolling friction between cam 242 and cable 243. Thus, this design is particularly suitable for maintaining a clean environment within vacuum chamber 215.

Cam 242 must be specially shaped in order to ensure that wafer holder 280 retracts (and extends) in an approximately linear manner along axis A. If the motion is to be linear, elementary plane geometry establishes that the angle θ between port axis A and axis M and the angle phi between arm axis N connecting the center of wafer holder 280 and passing through axis 273 in the plane of FIG. 6 are related by the formula:

$$\text{phi} = 90° - \theta + \cos^{-1}[(d/f)\sin\theta]$$

where d is the length of arm 252 from axis 250 to axis 273 and f is the length of axis N from axis 273 to the center of wafer holder 280.

Table I shows a printout of θ, phi, the difference (decrement) delta phi in the angle phi for constant increments in the angle θ of 3°, the ratio of the decrement in phi divided by the corresponding increment in θ, the x,y coordinates of axis 273, and the stroke (the x coordinate of the center of wafer handler 280, for the case where d=10 inches and f=14 inches).

TABLE I

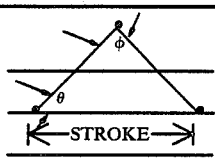

| X | Y | THETA | PHI | DIFF | RATIO | STROKE |
|---|---|---|---|---|---|---|
| 10.00 | 0.00 | 0.00 | 180.00 | | | 24.00 |
| 9.99 | 0.52 | 3.00 | 174.86 | 5.14 | 1.71 | 23.98 |
| 9.95 | 1.05 | 6.00 | 169.72 | 5.14 | 1.71 | 23.91 |
| 9.88 | 1.56 | 9.00 | 164.58 | 5.13 | 1.71 | 23.79 |
| 9.78 | 2.08 | 12.00 | 159.46 | 5.12 | 1.71 | 23.63 |
| 9.66 | 2.59 | 15.00 | 154.35 | 5.11 | 1.70 | 23.42 |
| 9.51 | 3.09 | 18.00 | 149.25 | 5.10 | 1.70 | 23.17 |
| 9.34 | 3.58 | 21.00 | 144.17 | 5.08 | 1.69 | 22.87 |
| 9.14 | 4.07 | 24.00 | 139.11 | 5.06 | 1.69 | 22.53 |
| 8.91 | 4.54 | 27.00 | 134.08 | 5.03 | 1.68 | 22.15 |
| 8.66 | 5.00 | 30.00 | 129.08 | 5.00 | 1.67 | 21.74 |
| 8.39 | 5.45 | 33.00 | 124.11 | 4.97 | 1.66 | 21.28 |
| 8.09 | 5.88 | 36.00 | 119.17 | 4.93 | 1.64 | 20.80 |
| 7.77 | 6.29 | 39.00 | 114.29 | 4.89 | 1.63 | 20.28 |
| 7.43 | 6.69 | 42.00 | 109.45 | 4.84 | 1.61 | 19.73 |
| 7.07 | 7.07 | 45.00 | 104.66 | 4.78 | 1.59 | 19.15 |
| 6.69 | 7.43 | 48.00 | 99.94 | 4.72 | 1.57 | 18.56 |
| 6.29 | 7.77 | 51.00 | 95.28 | 4.66 | 1.55 | 17.94 |
| 5.88 | 8.09 | 54.00 | 90.70 | 4.58 | 1.53 | 17.30 |
| 5.45 | 8.39 | 57.00 | 86.21 | 4.49 | 1.50 | 16.66 |
| 5.00 | 8.66 | 60.00 | 81.80 | 4.41 | 1.47 | 16.00 |
| 4.54 | 8.91 | 63.00 | 77.49 | 4.31 | 1.44 | 15.34 |
| 4.07 | 9.14 | 66.00 | 73.28 | 4.21 | 1.40 | 14.68 |
| 3.58 | 9.34 | 69.00 | 69.19 | 4.09 | 1.36 | 14.02 |
| 3.09 | 9.51 | 72.00 | 65.22 | 3.97 | 1.32 | 13.37 |
| 2.59 | 9.66 | 75.00 | 61.39 | 3.84 | 1.28 | 12.72 |
| 2.08 | 9.78 | 78.00 | 57.69 | 3.70 | 1.23 | 12.10 |
| 1.57 | 9.88 | 81.00 | 54.14 | 3.55 | 1.18 | 11.49 |
| 1.05 | 9.95 | 84.00 | 50.75 | 3.40 | 1.13 | 10.90 |
| 0.52 | 9.99 | 87.00 | 47.51 | 3.24 | 1.08 | 10.34 |
| 0.00 | 10.00 | 90.00 | 44.43 | 3.08 | 1.03 | 9.80 |
| −0.52 | 9.99 | 93.00 | 41.50 | 2.92 | 0.97 | 9.29 |
| −1.04 | 9.95 | 96.00 | 38.74 | 2.76 | 0.92 | 8.81 |
| −1.56 | 9.88 | 99.00 | 36.14 | 2.60 | 0.87 | 8.36 |
| −2.08 | 9.78 | 102.00 | 33.69 | 2.45 | 0.82 | 7.94 |
| −2.59 | 9.66 | 105.00 | 31.38 | 2.31 | 0.77 | 7.55 |
| −3.09 | 9.51 | 108.00 | 29.22 | 2.17 | 0.72 | 7.18 |
| −3.58 | 9.34 | 111.00 | 27.18 | 2.03 | 0.68 | 6.85 |
| −4.07 | 9.14 | 114.00 | 25.27 | 1.91 | 0.64 | 6.54 |
| −4.54 | 8.91 | 117.00 | 23.48 | 1.79 | 0.60 | 6.26 |
| −5.00 | 8.66 | 120.00 | 21.79 | 1.69 | 0.56 | 6.00 |
| −5.45 | 8.39 | 123.00 | 20.20 | 1.59 | 0.53 | 5.76 |
| −5.88 | 8.09 | 126.00 | 18.71 | 1.50 | 0.50 | 5.55 |
| −6.29 | 7.77 | 129.00 | 17.29 | 1.42 | 0.47 | 5.35 |
| −6.69 | 7.43 | 132.00 | 15.94 | 1.34 | 0.45 | 5.17 |
| −7.07 | 7.07 | 135.00 | 14.67 | 1.28 | 0.43 | 5.01 |
| −7.43 | 6.69 | 138.00 | 13.45 | 1.22 | 0.41 | 4.87 |
| −7.77 | 6.29 | 141.00 | 12.29 | 1.16 | 0.39 | 4.73 |
| −8.09 | 5.88 | 144.00 | 11.18 | 1.11 | 0.37 | 4.62 |
| −8.39 | 5.45 | 147.00 | 10.11 | 1.07 | 0.36 | 4.51 |
| −8.66 | 5.00 | 150.00 | 9.08 | 1.03 | 0.34 | 4.42 |
| −8.91 | 4.54 | 153.00 | 8.08 | 1.00 | 0.33 | 4.33 |
| −9.13 | 4.07 | 156.00 | 7.11 | 0.97 | 0.32 | 4.26 |
| −9.34 | 3.59 | 159.00 | 6.17 | 0.94 | 0.31 | 4.20 |
| −9.51 | 3.09 | 162.00 | 5.25 | 0.92 | 0.31 | 4.14 |
| −9.66 | 2.59 | 165.00 | 4.35 | 0.90 | 0.30 | 4.10 |
| −9.78 | 2.08 | 168.00 | 3.46 | 0.89 | 0.30 | 4.06 |
| −9.88 | 1.57 | 171.00 | 2.59 | 0.88 | 0.29 | 4.04 |
| −9.94 | 1.05 | 174.00 | 1.72 | 0.87 | 0.29 | 4.02 |
| −9.99 | 0.53 | 177.00 | 0.86 | 0.86 | 0.29 | 4.00 |
| −10.00 | 0.00 | 180.00 | 0.00 | 0.86 | 0.29 | 4.00 |

Cam 242 is designed in two stages. First, the ratio between the decrement delta phi in the angle phi divided by the corresponding increment delta $\theta$ in the angle $\theta$ is computed for each $\theta$. These ratios are then used to design a theoretical cam profile. If r represents the radius of pulley 254, for each angle $\theta$ (where $0 \leq < 180°$) a line segment having a length of (delta phi/delta $\theta$)r is placed with one end at the origin, with the line segment extending from the origin at an angle of $\theta - 90°$. A smooth curve passing through the ends of these line segments (radii) defines one portion of the theoretical cam profile. The remaining portion of the theoretical cam profile ($180° \leq < 360°$) is defined by requiring that the cam profile be symmetric with respect to the origin, since cable 242 is of fixed length and must wrap on one side of cam 242 as it unwraps from the other side.

Next, since cam 242 drives pulley 254 by means of a smooth stainless belt which wraps and unwraps on pulley 242, modifications to the above profile must be made to take into account this physical drive system. An iterative feed forward modification process is employed as described by the flow chart in FIG. 7a. Heuristically, the program starts with the selected angle $\theta_0$ and the corresponding theoretical cam radius $R_0$ and then checks for "interference" between the initial radius $R_0$ and subsequent theoretical radii $R_1, R_2, \ldots R_N$ corresponding to angles $\theta_0 +$ delta $\theta$, $\theta_0 + 2$ delta $\theta, \ldots, \theta_0 + N$ (delta $\theta$) for a selected positive integer N, and a selected delta $\theta$. "Interference" is defined by the inequalities appearing in the flow chart. Whenever an interference is found, the theoretical radius $R_0$ is reduced by 0.001 and the process repeated until the initial radius has been reduced so that it does not "interfere". This reduced value $R^*_0$ is then the initial radius (for the angle $\theta_0$) of the actual cam. The entire process is then repeated for the next theoretical radius $R_1$ and so on.

In the embodiment described above pulley 254 is circular. However, a similar process for defining the profile of cam 242 to provide linear motion may also be employed with circular pulley 254 being replaced by a noncircular cam (pulley).

Although the modular wafer transport and processing system of the present invention has been described primarily with respect to its application to semiconductor wafer or substrate processing, it should be understood that the inventive system is equally useful in the processing of many other wafer or disc-like workpieces. Neither is it required that other such workpieces have flats on their edges; workpieces which are fully circular in outline can be handled as well. More specifically, the inventive system is especially useful for processing any magnetic or optical storage medium in a wafer-like or disc-like form.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. A valve comprising:
   a valve body having a passage therethrough;
   a valve gate having a first position in which said passage is open and a second position in which a first portion and a second portion of the surface of said valve gate each extend across said passage thereby dividing said passage into a first region and a second region;
   sealing means, between said valve body and said first portion of said surface of said valve gate when said valve gate is in said second position, for providing a vacuum seal between said first region and said second region, a rotational moment being generated on said valve body by said sealing means being pressed between said first portion of said surface and said valve body when said valve gate is in said second position;

means between said second portion of said surface and said valve body when said valve gate is in said second position, for providing a rotational moment opposed to said rotational moment generated on said valve gate by said sealing means being pressed between said first portion of said surface and said valve body when said valve gate is in said second position, said means for providing a rotational moment not providing a vacuum seal between said first region and said second region; and means connected to said valve gate for translating said valve gate from said first position to said second position and from said second position to said first position.

2. A valve as in claim 1 wherein said passage through said valve body has a central plane and wherein the orthogonal projection of said second portion of said surface onto said central plane is narrower than the orthogonal projection of said first portion of said surface on said central plane as measured along an axis in said central plane connecting said first region to said second region.

3. A valve as in claim 2 wherein said first portion includes a planar surface and said second portion includes a planar surface.

4. A valve as in claim 3 wherein said planar surface of said first portion makes an angle less than or equal to 45° with said central plane.

5. A valve as in claim 3 wherein said planar surface of said second portion includes a first and a second planar surface, said second planar surface being perpendicular to said central plane.

6. A valve as in claim 1 wherein said valve gate has a first side and a second side parallel to said first side and wherein said valve gate is the union of a first gate region containing said first portion and said first side and a second gate region containing said second portion and said second side, said first gate region and said second gate region meeting in a common plane parallel to said first side and said second side wherein the distance between said common plane and said second side is less than the distance between said first side and said common plane.

7. A valve as in claim 6 wherein said first gate region has a trapezoidal cross section and said second gate region has a trapezoidal cross section.

8. A valve as in claim 6 wherein said second side includes a portion of said second portion of said surface.

9. A valve as in claim 6 further including bearing means contacting said first side and said second side.

10. A valve as in claim 1 wherein said means for providing a rotational moment comprises an elastomeric strip.

11. A valve as in claim 1 wherein said means for translating is positioned so that said rotational moment opposed to said rotational moment generated by said sealing means has the same absolute value as said rotational moment generated by said sealing means.

* * * * *